United States Patent [19]

Lampe et al.

[11] 4,156,923
[45] May 29, 1979

[54] METHOD AND APPARATUS FOR PERFORMING MATRIX MULTIPLICATION OR ANALOG SIGNAL CORRELATION

[75] Inventors: Donald R. Lampe, Ellicott City; Charles W. Brooks, Annapolis, both of Md.

[73] Assignee: Westinghouse Electric Corp., Pittsburgh, Pa.

[21] Appl. No.: 842,834

[22] Filed: Oct. 17, 1977

[51] Int. Cl.$^2$ .................. G06G 7/16; H03K 5/159
[52] U.S. Cl. .................. 364/844; 307/221 D; 364/819
[58] Field of Search ............ 364/841, 844, 862, 819; 307/221 D, 229; 357/24; 328/160, 167

[56] References Cited

U.S. PATENT DOCUMENTS

| | | | |
|---|---|---|---|
| 3,728,535 | 4/1973 | Dickman et al. | 364/841 |
| 3,956,624 | 5/1976 | Audaire et al. | 364/841 X |
| 4,032,767 | 6/1977 | Lagnado | 364/862 |
| 4,035,629 | 7/1977 | Lampe et al. | 364/862 |
| 4,052,606 | 10/1977 | Heller et al. | 364/862 X |

*Primary Examiner*—Joseph F. Ruggiero
*Attorney, Agent, or Firm*—H. W. Patterson

[57] ABSTRACT

A method and apparatus for multiplying a plurality of samples of first and second analog signals and summing the products there obtained. In stages of a first charge coupled device (CCD), charge packets corresponding to samples of the first analog signal are separated by charge packets corresponding to a first bias potential. In stages of a second CCD, charge packets corresponding to samples of the second analog signal are separated by charge packets corresponding to a second bias potential. In each step, a sum-of-products of samples and bias potentials is obtained. In circuitry coupled to the CCDs including switches and charge storage devices, the switches are operated to charge the charge storage devices with current or charges corresponding to sums-of-products of the signal samples and the bias potentials so as to provide via an output charge storage device, current corresponding to only the sums-of-products of the samples of the first and second analog signals without erroneous contributions due to multiplier threshold non-uniformities. Apparatus implementing the method can perform such functions as auto-correlation, cross-correlation, convolution, transversal filtering, and analog matrix multiplication, for example. In one aspect of the apparatus of the present invention, a first charge transfer analog delay means includes one charge transfer shift register channel and a second charge transfer delay means includes two charge transfer shift register channels. Each of said shift register channels includes a plurality of stages for holding and propagating charge packets. In a different aspect of the apparatus of the present invention, two charge transfer delay means each include two charge transfer shift register channels. In each of the aforementioned aspects of the invention, the device correlates, for example, analog signals propagating through the first analog delay means against analog signals propagating through the second analog delay means.

9 Claims, 25 Drawing Figures

METHOD AND APPARATUS FOR PERFORMING MATRIX MULTIPLICATION OR ANALOG SIGNAL CORRELATION

GOVERNMENT CONTRACT

The invention herein described was made in the course of or under a contract or subcontract thereunder with the National Aeronautics and Space Administration.

BACKGROUND OF THE INVENTION

1. Field of the Invention

This invention relates to a method and apparatus for summing the products of samples of analog signals, to discrete analog signal processing (DASP) systems and, more particularly, to systems employing CCD devices configured for implementing a real-time, fully-analog correlator or convolver.

2. State of the Prior Art

Matrix multiplication of analog signals and, in particular, analog signal correlation, for example, has been performed by such techniques as converting the analog signals to digital signals and performing digital multiplication or correlation. However, such A/D conversion techniques require large amounts of hardware which uses relatively large amounts of space and decreases system reliability.

It is desirable, therefore, to devise a method and apparatus for analog signal matrix multiplication or correlation which does not include A/D conversion.

An application, concurrently filed herewith, and entitled "CMOS Analog Multiplier for CCD Signal Processing" of Lampe, et al., is of interest for its disclosure of a balanced differential conductance-type MOS transistor multiplier using complementary MOS transistors.

Also of interest is U.S. Pat. No. 4,035,329 by Lampe, et al., assigned to the common assignee which discloses an extended correlated doubling sampling system which corrects for errors in components of the system.

Application Ser. No. 625,696, filed Oct. 29, 1975, entitled "A Dual-CCD Real Time, Fully-Analog Correlator", by Lampe, et al., is of interest for its disclosure of a general-purpose fully analog correlator including two CCD channels for processing samples of analog signals and MOSFET multipliers for providing products of the signal samples.

SUMMARY OF THE INVENTION

In accordance with the present invention, a method for producing a sum-of-products of samples of a first and second analog signals includes a four step sequential process whereby erroneous contributions to the output sum-of-products due to non-uniform MOS thresholds such as source-drain erroneous harmonics are eliminated and all undesired product terms associated with the DC "fat zero" or with MOS multiplier threshold deviations are cancelled sequentially in the same multiplying element.

Charge corresponding to a first bias potential is injected into a first CCD aternately with charge corresponding to samples of the first analog signal offset by the first bias potential. Charge corresponding to a second bias potential is injected into a second CCD alternately with charge corresponding to samples of the second analog signal offset by the second bias potential.

The algebraic combination of the signals includes additive and subtractive contributions: The additive contributions include both the sum-of-products of offset samples of the first and second analog signals and the sum-of-products of the first and second bias potentials while the subtractive contributions include the sum-of-products of offset samples of the first analog signal and the second bias potential and the sum-of-products of offset samples of the second analog signal and the first bias potential.

A preferred embodiment of apparatus for performing the method of the present invention includes a first charge transfer analog delay means having at least one charge transfer shift register channel and a second charge transfer delay means having at least two charge transfer shift register channels, said shift register channels each including a plurality of stages for holding and propagating charge packets. Input means are associated with each of the first and second analog delay means for injecting charge packets thereinto. A plurality of multiplying means are provided, for example CMOS transistors, for providing output signals indicative of the products of charge in the stages of first and second delay means. Summing circuitry is effective to provide a sum of the output signals provided by the multipliers, i.e., to provide a sum-of-products of the charges in the stages of the first and second delay means. Circuitry is included for storing an output signal indicative of the current corresponding to the sum of the products output provided by the summing circuitry.

DESCRIPTION OF THE PREFERRED EMBODIMENT

Figure 1:
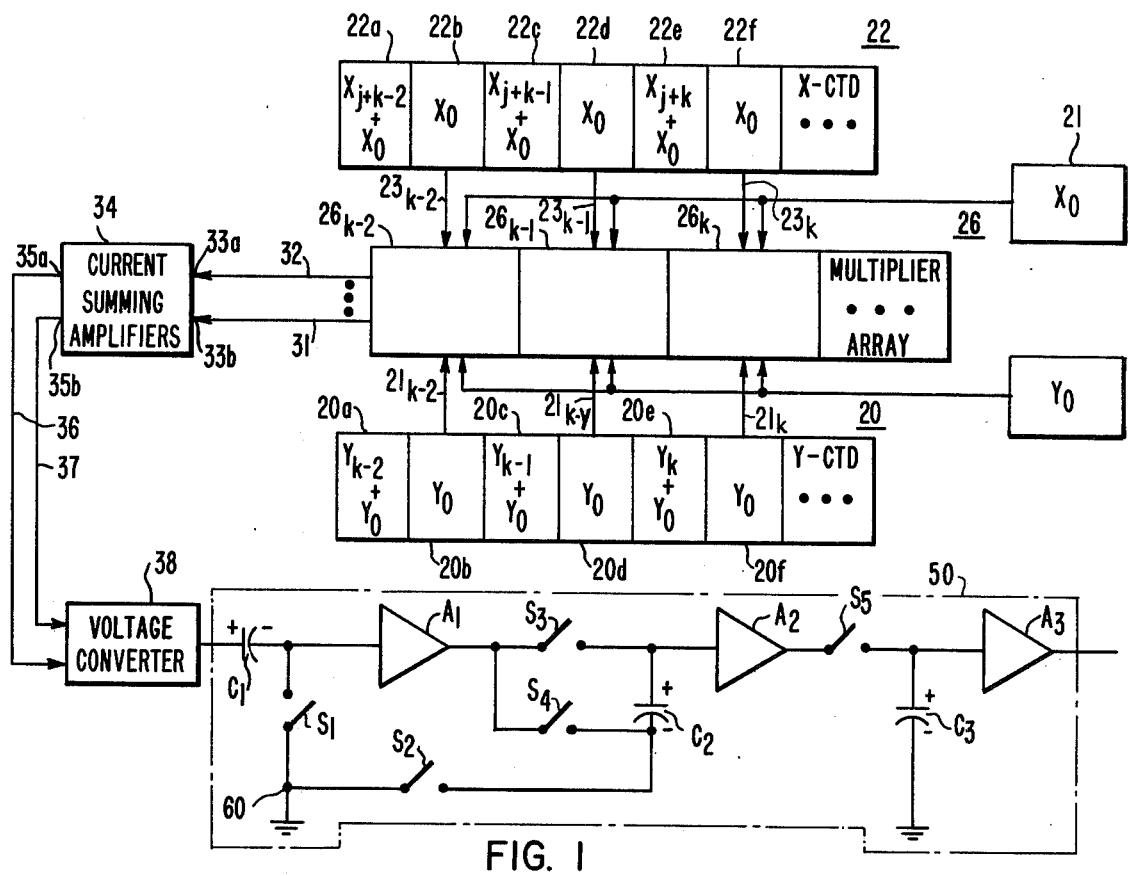
FIG. 1 shows a general block diagram of apparatus, for example, that may be used in the method of the present invention.

FIG. 1 shows a general block diagram, for example, that may be used in the method of the present invention. A Y charge coupled device (CCD) at 20, and a X CCD at 22 include, respectively, stages 20a through 20f and 22a through 22f, for example, for holding and shifting charge packets. Stages 20a through 20f and stages 22a through 22f are shown for purposes of illustration only and other stages may precede or follow them in the device. A multiplier array at 26 includes multiplying elements ... $26_{K-2}$, $26_{K-1}$, and $26_K$ ..., for example, each having outputs (not shown) coupled to lines 31 and 32 and each of which multiplying elements includes two inputs for providing on the outputs coupled to lines 31 and 32 a signal indicative of the product of signals applied to the two inputs. Multipliers $26_{K-2}$, $26_{K-1}$, and $26_K$ are for purposes of illustration only and other multipliers may precede or follow them in the array. Stages 22b and 20b are coupled to multiplier $26_{K-2}$ by lines $23_{K-2}$ and $21_{K-2}$, respectively, stages 22d and 20d are coupled to multiplier $26_{K-1}$ by lines $23_{K-1}$ and $21_{K-1}$, respectively, and stages 22f and 20f are coupled to multiplier $26_K$ by lines $23_K$ and $21_K$, respectively, for example, such that the output signals of the multipliers $26_{K-2}$, $26_{K-1}$, and $26_K$ are indicative of the products of the charges in the stages 20b and 22b, 20d and 22d, and 20f and 22f, respectively.

A current summing device 34 having inputs 33a and 33b to which are coupled lines 31 and 32, is effective to sum the products output by the multipliers at 26 to provide a signal on outputs 35a and 35b and lines 36 and 37 indicative of the sum of the products of the charges in the stages of CCD 20 and CCD 22. Current summing device 34 may be any conventional device used for such purposes, such, for example, as circuitry including operational amplifiers with resistive feedback. A differential current-to-voltage conversion device 38 is coupled to summing device 34 by lines 36 and 37 and is effective to convert the sum-of-products current on lines 36 and 37 to a corresponding voltage to provide a signal suitable for charging the capacitors $C_1$, $C_2$, and $C_3$ of circuit 50 of FIG. 4. Voltage conversion device 38 may be any conventional device used for such purposes, such as, for example, circuitry including an operational amplifier having resistive feedback.

The circuit within the lines at 50 includes capacitors $C_1$, $C_2$, and $C_3$, switches $S_1$, $S_2$, $S_3$, $S_4$, and $S_5$, and buffers $A_1$, $A_2$ and $A_3$. Capacitor $C_1$ is coupled between voltage converter 38 and buffer $A_1$. One side of switch $S_1$ is coupled between capacitor $C_1$ and the input of buffer $A_1$ and the other side is coupled to ground point 60. Switches $S_2$ and $S_4$ couple one side of capacitor $C_2$ to ground point 60 and the output of the buffer $A_1$, respectively. The other side of capacitor $C_2$ is coupled to the output of buffer $A_1$ via switch $S_3$ and to the input of buffer $A_2$. One side of capacitor $C_3$ is coupled to the ground point 60 and the other side of capacitor $C_3$ is coupled to the output of buffer $A_2$ via switch $S_5$ and to the input of buffer $A_3$.

In accordance with the method of the present invention, charge packets are injected into the stages of the X CCD 22 and the Y CCD 20 in the order shown in FIG. 1, for example. In Y CCD 20, a charge packet corresponding to a bias potential Yo is injected after which a sample of the offset signal ($Y_o + y$) is injected. The subscripts $k-2$, $k-1$, and $k$ represent the time sequence of injection of the samples of the $Y_o + y$ signal. The sequence is repeated to obtain a result such as, for example, that shown in FIG. 1 where a first stage in a group of stages contains a charge packet corresponding to Yo and a second stage contains a charge packet corresponding to a sample of the signal y offset by Yo. Such a group of stages, for example, is stages 20a and 20b. In X CCD 22, a charge packet corresponding to a bias potential Xo is injected after which the offset sample of a signal ($X_o + x$) is injected. The sequence is repeated to obtain a result such as, for example, shown in X CCD 22 in FIG. 1 where a first stage in a group of stages contains a charge packet corresponding to Xo and a second stage in the group contains a charge packet corresponding to the signal x offset by Xo. Such a group of stages, for example, is stages 22a and 22b.

Figure 3:
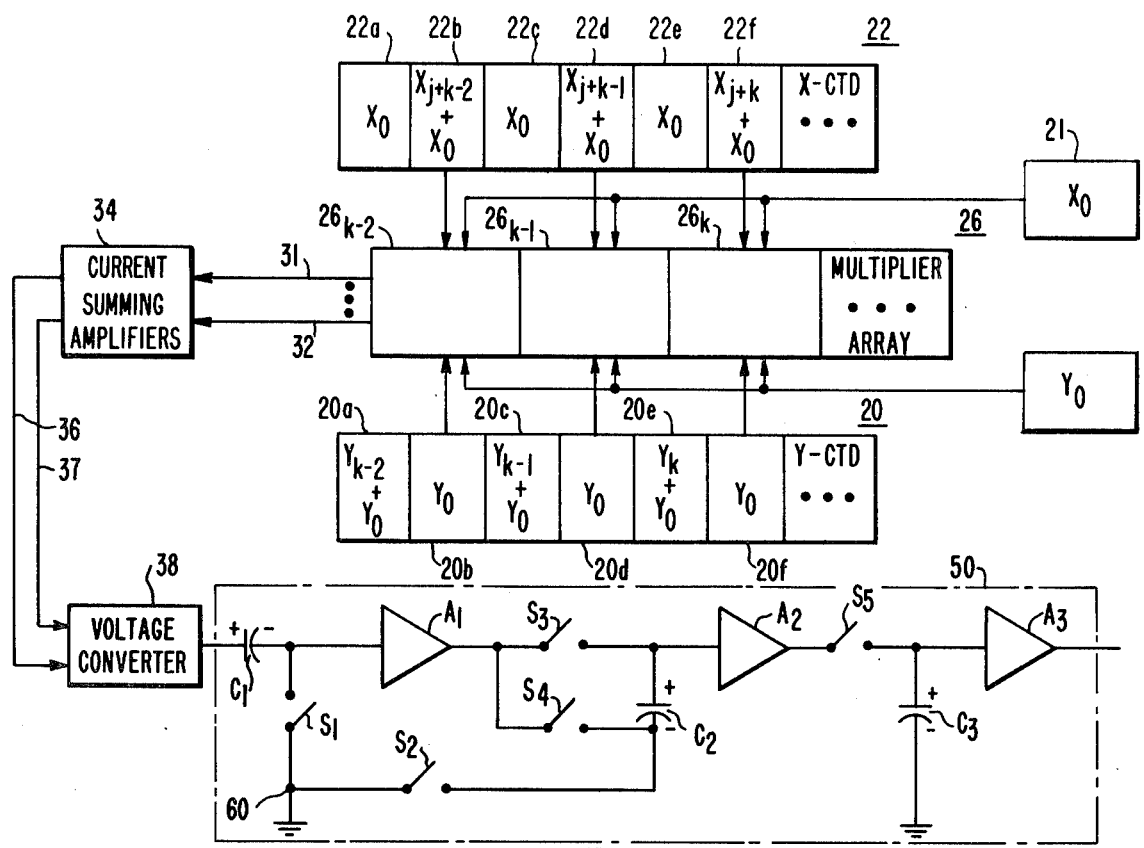
FIGS. 3, 6, 9, and 12 show the results of the shifting of charge in the apparatus of FIG. 1.

Assuming the initial conditions shown of the CCDs 20 and 22 in FIG. 3, four steps are required in order to multiply the signal samples ... $X_{j+k-2}$, $X_{j+k-1}$, $X_{j+k}$ ... and the signal samples ... $Y_{k-2}$, $Y_{k-1}$, $Y_k$, ... according to the method of the present invention.

Step 1

In a first step, for example, the charges contained in the stages of the X CCD 22 are shifted forward in a conventional manner by one stage with respect to the charges contained in the stages of the Y CCD 20 shown in FIG. 1. Such a result is shown in FIG. 3 where reference potential Xo occupies stage 22a and alternate stages and the offset signal samples $X_{j+k-2}$, $X_{j+k-1}$, and $X_{j+k}$ occupy stages 22b, 22d, and 22f, respectively, and alternate stages. The stages 20a through 20f of Y CCD 20 contain the same charge packets as shown in FIG. 1. The product output current of each multiplier . . . $26_{k-2}$, $26_{k-1}$, $26_k$ . . . is coupled to lines 31 and 32. Current summing amplifier 34 sums the product currents of the multipliers . . . $26_{k-2}$, $26_{k-1}$, $26_k$ . . . and voltage converter 38 converts the sum-of-products current on lines 36 and 37 to a voltage. For example, where the multipliers at 26 of FIG. 1 each include an MOS transistor such as a transistor 100 of FIG. 2, the drain of which is coupled to a source follower buffer 102 and the source of which is coupled to a source follower buffer 104, the sum-of-products current $I_1$ on line 36 or 37 is:

$$I_1 = \sum_{k=1}^{N} [a_k^+ (Y_o - V_{T+}^k)(X_{j+k} + V_{Tx}^k - V_{Tx}') + \tag{1}$$
$$B_k^+ (X_{j+k} + V_{Tx}^k - V_{Tx}')^2]$$

where:
 $k$ = the $k^{th}$ multiplier
 $V_{T+}^k$ = the equivalent threshold voltage of the $k^{th}$ multiplying MOS transistor 100
 $V_{Tx}^k$ = the equivalent threshold voltage of the source follower buffer 102
 $V_{Tx}'$ = the equivalent threshold voltage of the common/dummy source follower buffer 104
 N = the number of multipliers in array 26.
 $a_k^+$ = geometric constant associated with $k^{th}$ transistor multiplier, e.g. channel width-to-length ratio, signal charge mobility, oxide capacitances.
 $B_k^+ = \frac{1}{2} a_k^+$ (to a second order approximation).

Figure 2:
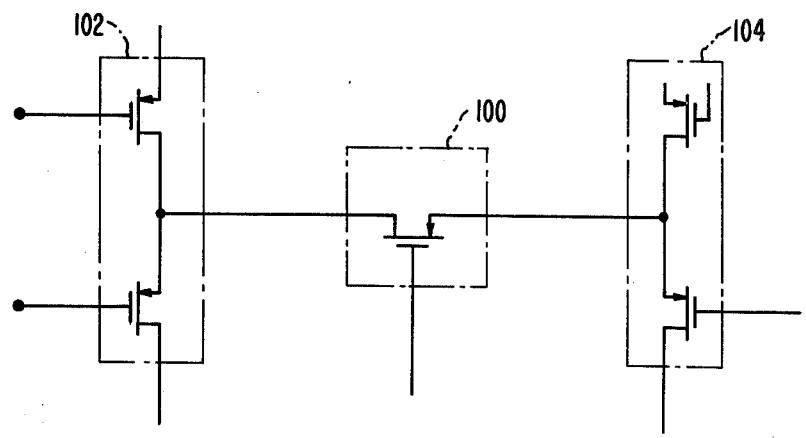
FIG. 2 shows a simple multiplier circuit such as can be used in the apparatus of FIG. 1.

Using such a configuration as the multiplier circuit of FIG. 2, the reference potential Xo corresponds to the term ($V_{Tx}^k - V_{Tx}$) in equation (1). However, the multipliers at 26 can be any analog multiplying element having two inputs and an output providing a signal proportional to or indicative of the products of input signals applied to the two inputs. The use of an MOS transistor as the multiplying element is only for purposes of illustration of the method of the present invention.

Figure 4:
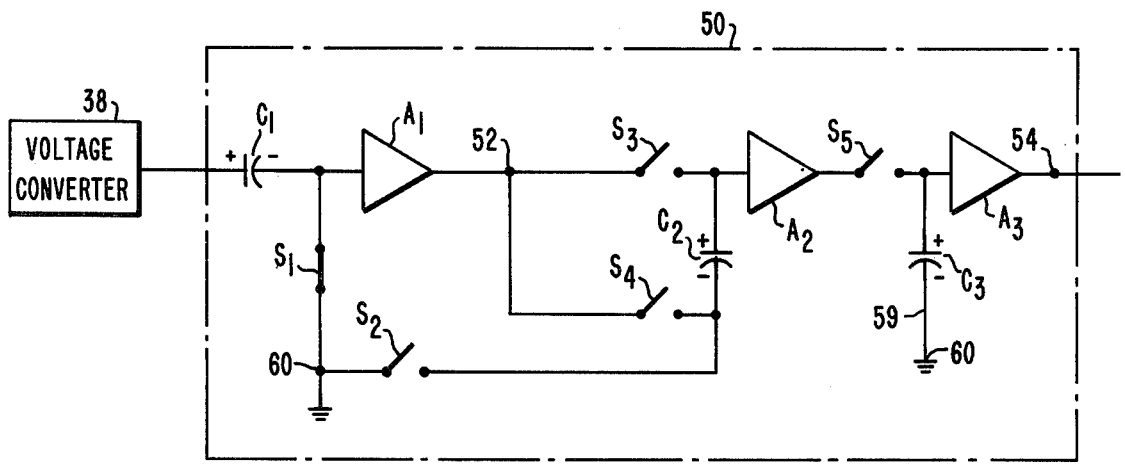
FIGS. 4, 7, 10, and 13 show the positions of switches in the apparatus of FIG. 1 in the steps of the method of the present invention.
Figure 5:
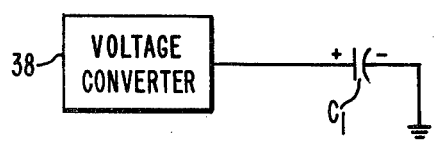
FIGS. 5, 8, 11, and 14 show the equivalent circuits of the apparatus of FIGS. 4, 7, 10, and 13, respectively.

When the switch $S_1$ is closed, as shown in circuit 50 of FIG. 4, the capacitor $C_1$ charges to a voltage representative of the current $I_1$. FIG. 5 shows an equivalent circuit of the conditions of circuit 50 as shown in FIG. 4. The buffer $A_2$ is effective to allow capacitor $C_3$ to charge while isolating capacitors $C_2$ and $C_3$. Switch $S_1$ is then opened, clamping the voltage representative of the current $I_1$ onto the capacitor $C_1$. At the end of step one, then, the switches $S_1$ through $S_5$ in the circuit 50 of FIG. 3 are open.

Step 2

Figure 6:
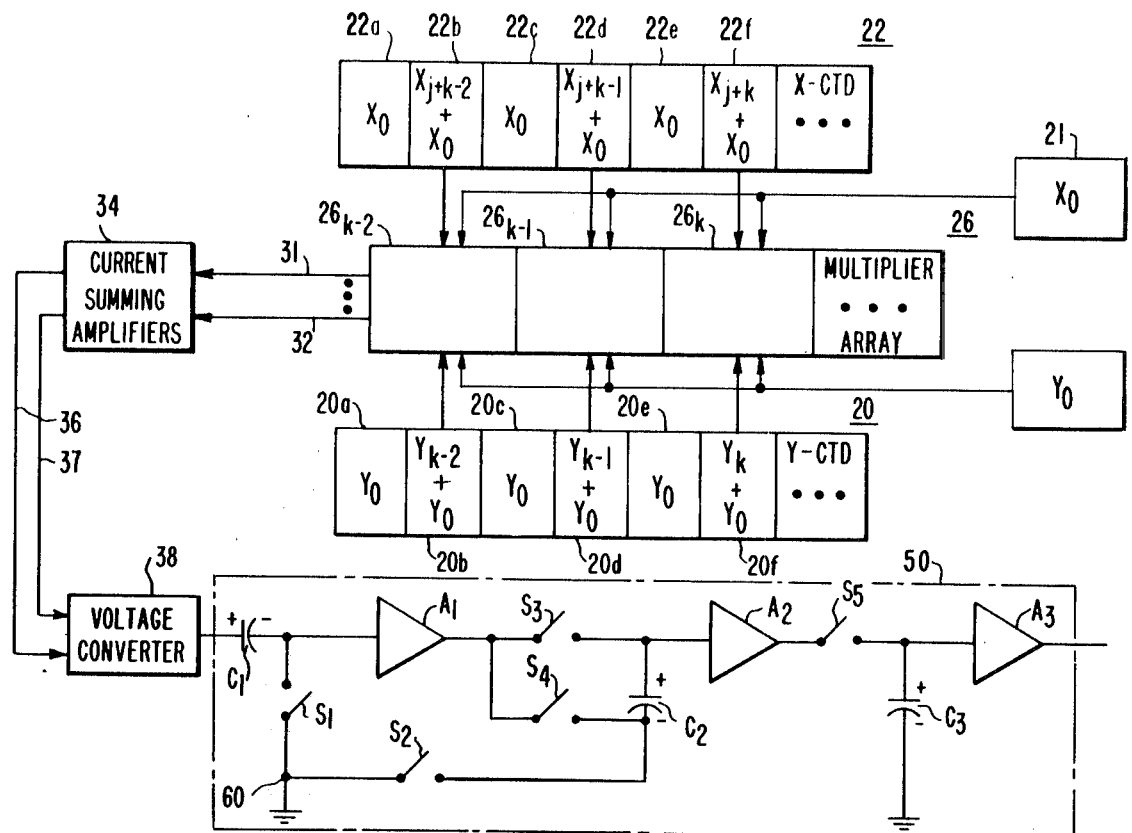

In a second step, for example, the charges contained in the stages of the Y CCD 20 are shifted forward in a conventional manner with respect to the charges contained in the X CCD 22 shown in FIG. 3. Such a result is shown in FIG. 6 where reference potential Yo occupies stage 20a and alternate stages and offset signal samples $Y_{k-2}, Y_{k-1}, Y_k \ldots$ occupy stages 20b, 20d, and 20f, respectively, and alternate stages. The stages 22a through 22f of X CCD 22 contain the same charge packets as shown in FIG. 3. The sum-of-products current $I_2$ on line 36 or 37 is:

$$I_2 = \sum_{k=1}^{N} [\alpha_k^+(Yo + Y_k - V_{T+}^k)(X_{j+k} + V_{Tx}^k - V_{Tx}) + \beta_k^+(X_{j+k} + V_{Tx}^k - V_{Tx})^2] \quad (2)$$

Figure 7:
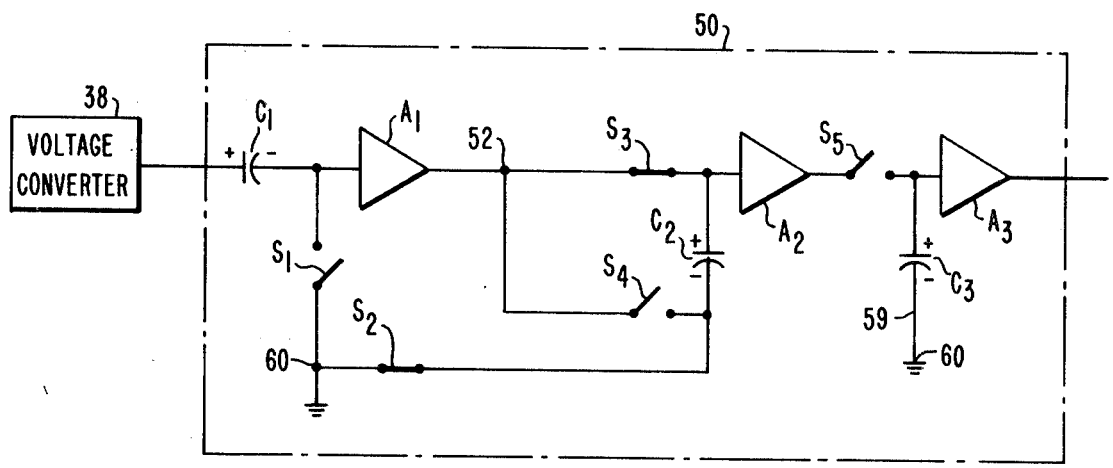
Figure 8:
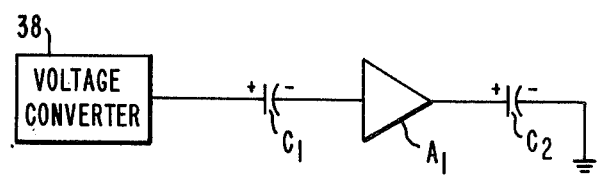

Next, switches $S_2$ and $S_3$ are closed as shown in the circuit 50 of FIG. 7 connecting capacitor $C_2$ to ground point 60. FIG. 8 shows an equivalent circuit of the conditions of circuit 50 as shown in FIG. 7. According to the equivalent circuit of FIG. 8, voltage representative of current $I_2$ is subtracted from the voltage representative of current $I_1$. Capacitor $C_2$ charges with the difference voltage representative of the difference current $I_3$ where:

$$I_3 = I_1 - I_2$$

The difference current $I_3$ is:

$$I_3 = \sum_{k=1}^{N} [\alpha_k^+(Y_k)(X_{j+k} + V_{Tx}^k - V_{Tx})] \quad (3)$$

The buffer $A_1$ can be a high input impedance/low output impedance amplifier, typically of unity gain, for providing a suitably low output impedance to allow capacitor $C_2$ to charge while isolating the capacitor $C_2$ from the capacitor $C_1$. Switches $S_2$ and $S_3$ are then opened and at the end of step two, the switches $S_1$ through $S_5$ of the circuit of FIG. 7, 50 are open.

Step 3

Figure 9:
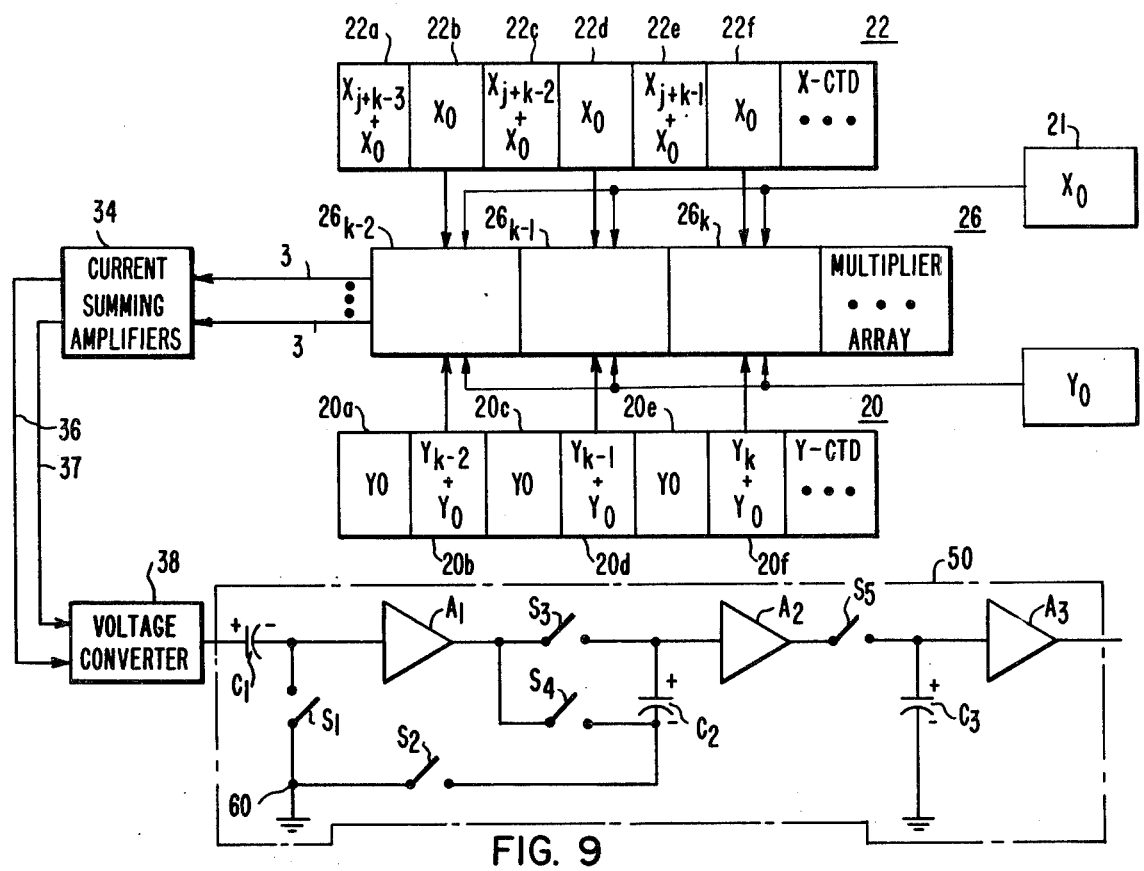

In step three, for example, the charges contained in the stages of the X CCD 22 are shifted forward by one stage in a conventional manner with respect to the charges contained in the stages of the Y CCD 20 shown in FIG. 6. Such a result is shown in FIG. 9 where reference potential Xo occupies stage 22b and alternate stages and offset signal samples $X_{j+k-3}, X_{j+k-2}, X_{j+k-1}, \ldots$ occupy stages 22a, 22c, and 22e, respectively, and alternate stages. The stages 20a through 20f contain the same charges as shown in FIG. 6. The sum of the products current $I_4$ on line 36 or 37 is:

$$I_4 = \sum_{k=1}^{N} [\alpha_k^+(Yo + Y_k - V_{T+}^k)(V_{Tx}^k - V_{Tx}) + \beta_k^+(V_{Tx}^k - V_{Tx})^2] \quad (4)$$

Figure 10:
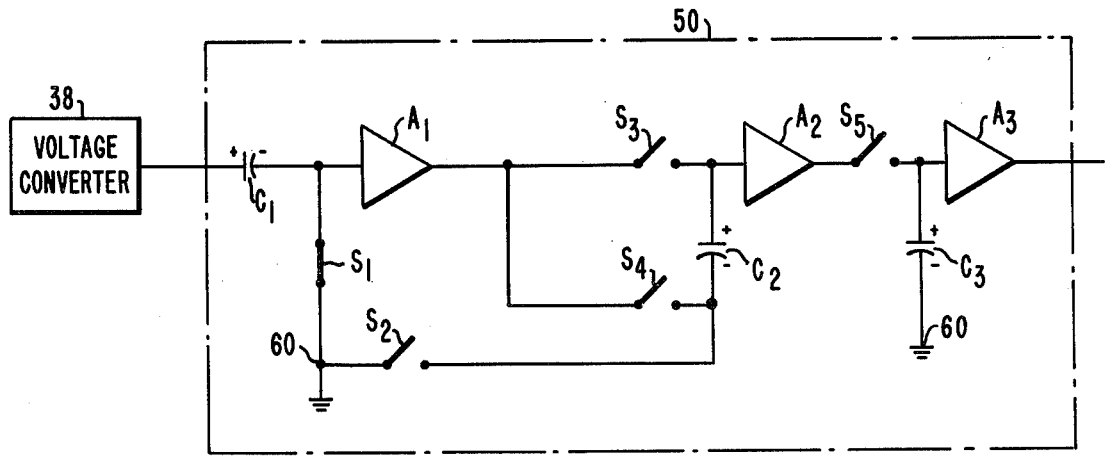
Figure 11:
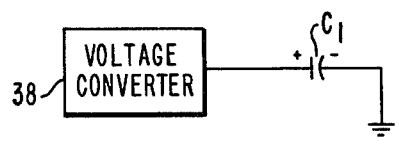

Next, switch $S_1$ is closed as shown in the circuit 50 of FIG. 10 connecting the capacitor $C_1$ to ground point 60. FIG. 11 shows an equivalent circuit of the conditions of circuit 50 as shown in FIG. 9. Capacitor $C_1$ then charges with the current $I_4$. Reviewing, after the third step, capacitor $C_2$ is charged with the voltage representative of the current $I_3$ and capacitor $C_1$ is charged with the voltage representative of the current $I_4$. Switch $S_1$ is then opened and, at the end of step three, the switches $S_1$ through $S_5$ of the circuit 50 of FIG. 9 are open.

Step 4

Figure 12:
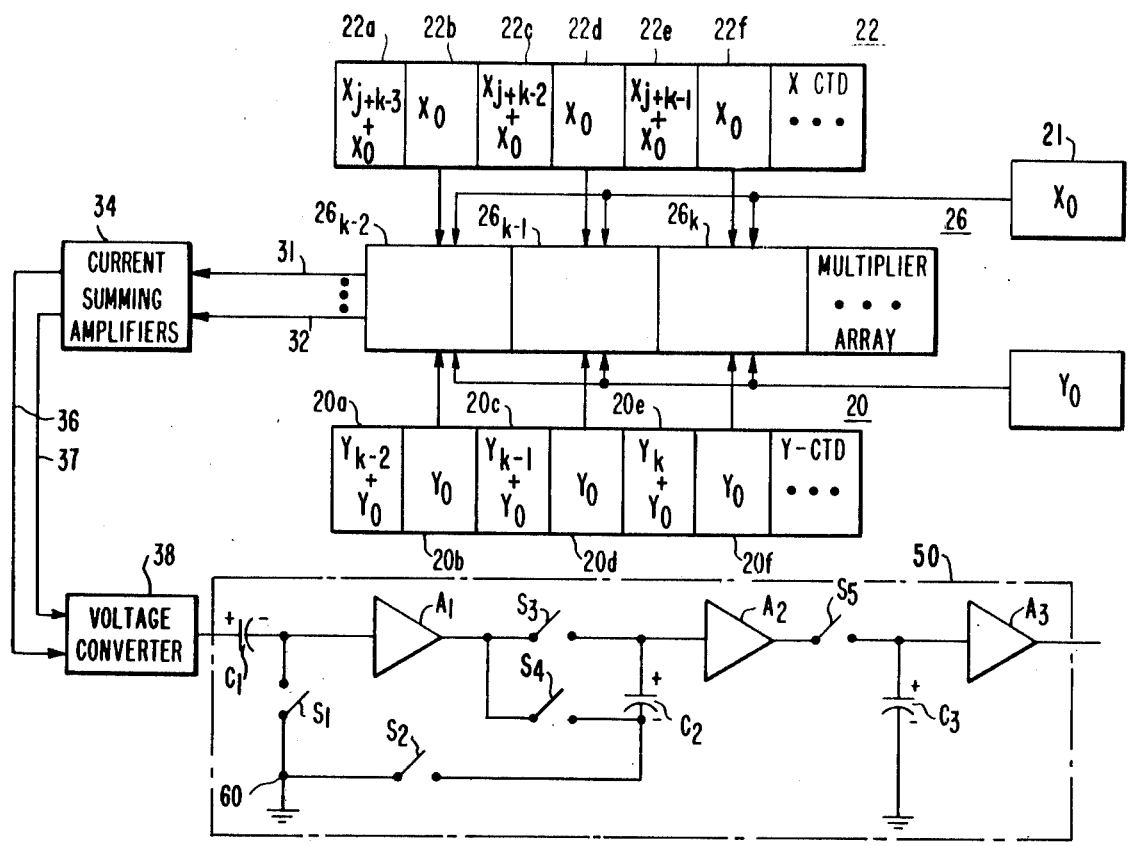

In a fourth step, for example, the charges contained in the stages of the Y CCD 20 can be shifted forward in a conventional manner if a completely new vector dot-product is desired, or shifted backward if additional dot products with the same replica vector are desired, as for correlation or convolution functions. A backward shift gives a result such as shown in FIG. 12 where reference potential Yo occupies stage 20b and alternate stages and the offset signal samples $Y_{k-2}, Y_{K-1}$, and $Y_k$ occupy stages 20a, 20c, and 20e, respectively, and alternate stages. The stages 22a through 22f contain the same charge packets as shown in FIG. 9. The sum-of-products current $I_5$ on line 36 or 37 is:

$$I_5 = \sum_{k=1}^{N} [\alpha_k^+(Yo - V_{T+}^k)(V_{Tx}^k - V_{Tx}) + \beta_k^+(V_{Tk}^k - V_{Tx})^2] \quad (5)$$

The voltage representative of the current $I_5$ substracts from that of the current $I_4$ in capacitor $C_1$ resulting in a voltage representative of the difference current $I_6$ in capacitor $C_1$ where:

$$I_6 = I_4 - I_5 = \sum_{k=1}^{N} \alpha_k Y_k(V_{Tx}^k - V_{Tx}) \quad (6)$$

Figure 13:
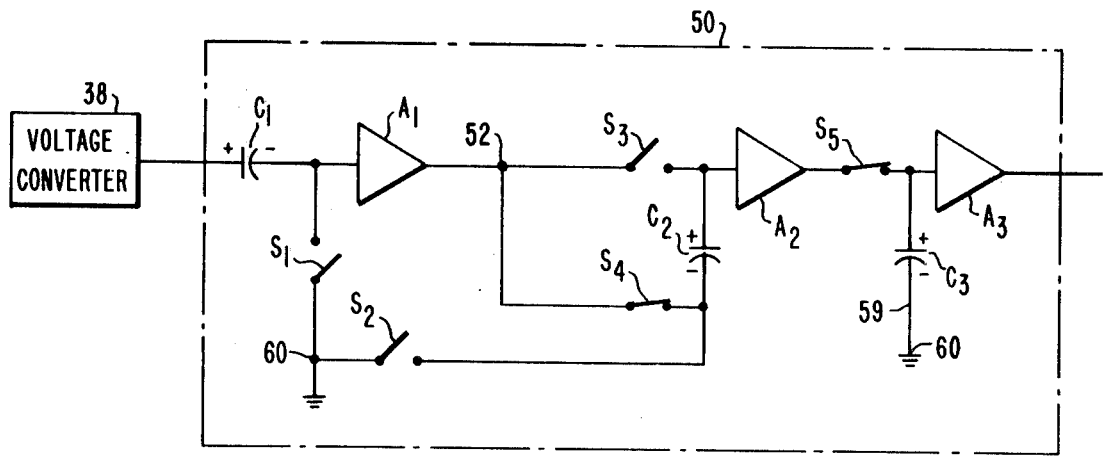
Figure 14:
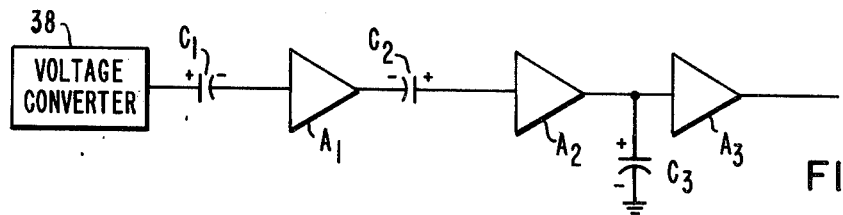

Next, switches $S_4$ and $S_5$ are closed as shown in the circuit 50. FIG. 14 shows an equivalent circuit of the conditions of circuit 50 as shown in FIG. 13. According to the equivalent circuit of FIG. 14, voltage representative of the second difference current $I_6$ adds to the voltage representative of the first difference current $I_3$ in capacitor $C_2$ to provide a voltage representative of the summed current $I_7$ in capacitor $C_3$ where:

$$I_7 = I_3 + I_6 = -\sum_{k=1}^{N} \alpha_k Y_k X_{j+k} \quad (7)$$

The buffer $A_3$ can be a high input impedance/low output impedance amplifier, typically of unity gain for providing a suitably low output impedance to drive an output device not shown and for providing a suitably high input impedance in order to prevent leakage of any charge from the capacitor $C_3$.

The current $I_7$ corresponds to the product of only the desired signal samples and the coefficient $\alpha_k^+$. Multiplier non-linearities and DC "fat zero" or bias potential terms are cancelled.

Figure 15:
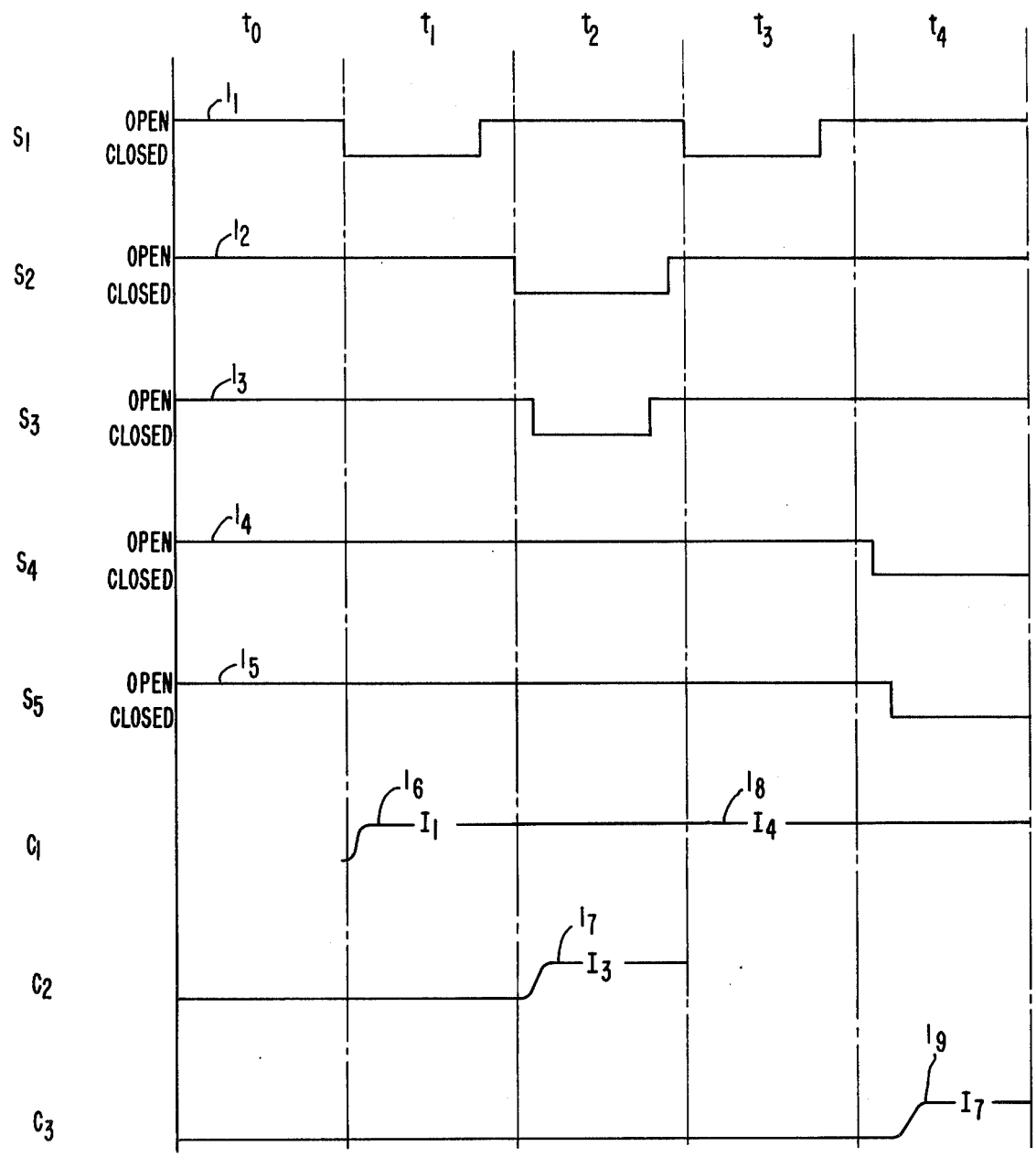
FIG. 15 shows a sequence of opening and closing the switches and the charges in the capacitors of the apparatus of FIG. 1 for steps of the method of the present invention.

FIG. 15 shows, in a timing diagram, the operation of the switches $S_1$ through $S_5$ according to the steps of the method of the present invention. Time period $t_0$ is an initial time period prior to beginning the correlation process. Time periods $t_1$, $t_2$, $t_3$, and $t_4$ correspond to steps 1, 2, 3, and 4, respectively. Below the timing lines corresponding to the switches $S_1$ through $S_5$, are lines $l_6$ through $l_9$ designating the voltage representative of the current in the capacitors $C_1$ through $C_3$ for each step of the method of the present invention. In time period $t_1$ (step 1), capacitor $C_1$ charges to the voltage representative of the current $I_1$ as shown by line $l_6$. In time period $t_2$ (step 2), capacitor $C_2$ charges to the voltage representative of the difference current $I_3$ as shown by line $l_7$. In time period 3 (step 3), capacitor $C_1$ charges to the voltage representative of the current $I_4$ as shown by line $l_8$. In time period 4 (step 4), capacitor $C_3$ charges to the voltage representative of the current $I_7$ as shown by line $l_9$.

In FIGS. 16 through 24 which are used to describe the apparatus suitable for implementing the method of the present invention, reference characters have a superscript a to distinguish from characters used in describing the method itself.

Figure 16:
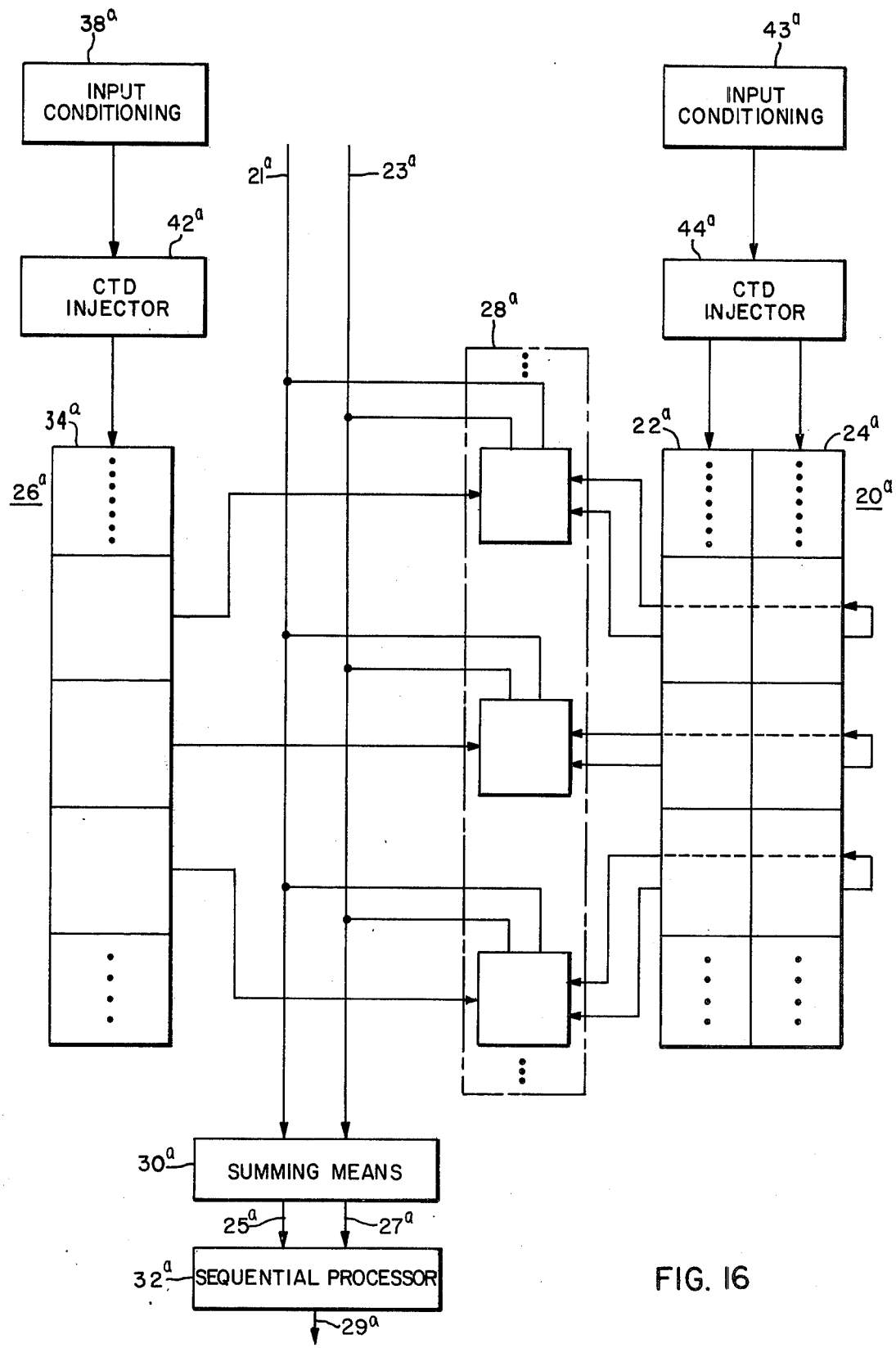
FIG. 16 shows a functional block diagram of an analog-analog correlator suitable for implementing the method of the present invention.
Figure 17:
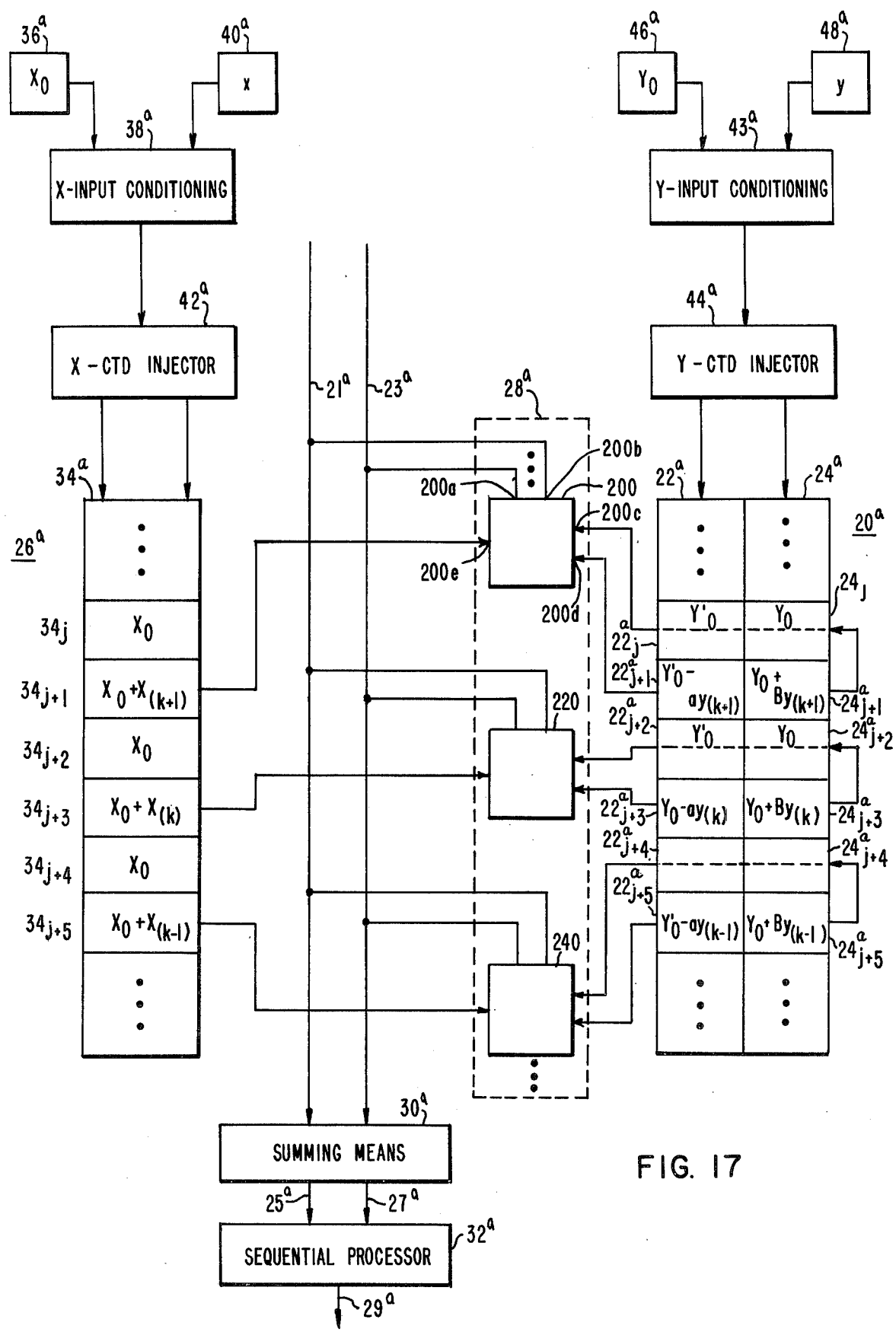
FIG. 17 shows a particular sequence of charge packets in the shift registers of the correlator of FIG. 16.
Figure 19:
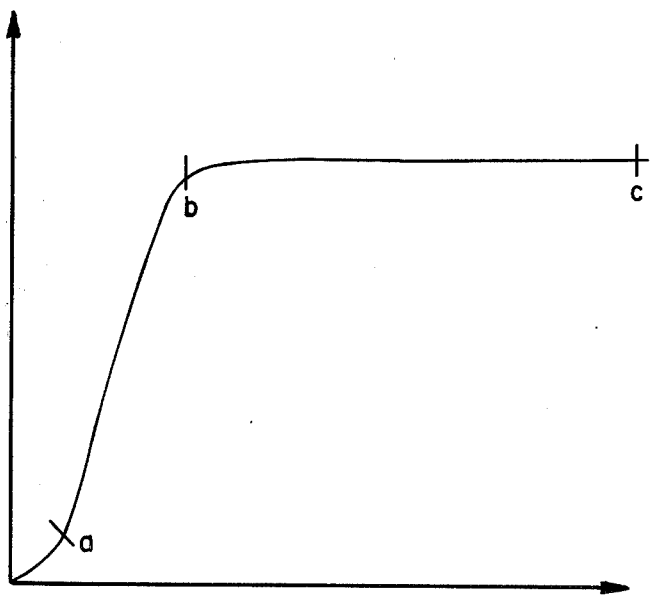
FIG. 19 shows a graph of drain voltage vs. drain current for a MOS transistor.

FIG. 16 shows a functional block diagram of an analog-analog correlator, for example, as an example of apparatus suitable for implementing the method of the present invention. Analog delay means $20^a$ comprises shift registers $22^a$ and $24^a$. Analog delay means $26^a$ comprises at least one shift register device $34^a$. An input conditioner $38^a$ for providing signals indicative of signals therein is coupled to an injector $42^a$. Injector $42^a$ provides to delay means $26^a$ charge packets indicative of signals provided by input conditioner $38^a$. An input conditioner $43^a$ for providing signals indicative of signals therein is coupled to an injector $43^a$. Injector $44^a$ provides to delay means $20^a$ charge packets indicative of signals provided by input conditioner $43^a$. A more detailed illustration of the analog delay means $26^a$ is shown in FIG. 17, in which embodiment the analog delay means includes one shift register channel or device $34^a$. A different embodiment of the invention is shown in FIG. 19, in which embodiment the analog delay means $26^a$ includes two shift register channels or devices $34^a$ and $78^a$. Referring back to FIG. 16, signals in shift registers $22^a$ and $24^a$ of the analog delay means $20^a$ are correlated against signals in the analog delay means $26^a$ by means of the multipliers within the dashed lines at $28^a$. The multipliers at $28^a$ produce current products that are summed for all multipliers by the summing amplifier $30^a$ via the lines $21^a$ and $23^a$. The summed current products provided by the amplifier $30^a$ are processed through the sequential multiply operator $32^a$ to eliminate array threshold nonuniformities.

Referring to FIG. 17, one embodiment of the present invention is shown wherein the analog delay means $26^a$ includes the shift register device $34^a$ having, for example, stages $34_j{}^a$ through $34_{j+5}{}^a$. In operation of the device of FIG. 17, the input conditioning means $38^a$ is effective to first sample and hold a DC bias potential $X_0$ shown within the box at $36^a$, and then sample and hold a signal corresponding to the sum of a signal x represented within the box at $40^a$ and the bias potential $X_0$, i.e., $X_0+x$. The injector means $42^a$ is effective to convert the signals received from the input means $38^a$ into charge packets suitable for propagation through the shift register $34^a$. Charge packets corresponding to the bias potential $X_0$ and the sum $X_0+x$ are injected into the register $34^a$ in the sequence, $X_0$, $X_0+x$, and propagate through the register $34^a$ as other charge packets are injected into the register $34^a$ in the same sequence, i.e., $X_0$, $X_0+x$. The stages $34_j{}^a$ through $34_{j+5}{}^a$, for example, illustrate such a sequence, where the subscripts (j) through (j+5) denote the sequential position of the stages in the register $34^a$. The subscripts k+1, k, and k−1 of the function signal x shown in the stages $34_{j+1}{}^a$, $34_{j+3}{}^a$ and $34_{j+5}{}^a$, respectively, denote the sequence of injection of the corresponding charge packets by the injector $42^a$ into the shift register $34^a$. For example, the charge packet $X_0+x_{(k-1)}$ is injected before the charge packet $X_0+x_{(k)}$.

Referring to the analog delay means 20, the input conditioning means $43^a$ is effective to first sample and hold a bias potential $Y_0$ represented within the box at $46a$ and then to sample and hold a signal corresponding to the sum of the bias potential $Y_0$ and a signal y, i.e., $Y_0+y$ represented within the box $48^a$. The injector means $44^a$ is effective to convert the signals received from the input means $43^a$ into charge packets suitable for propagation through the shift registers $22^a$ and $24^a$. The registers $22^a$ and $24^a$ include, for example, stages $22_j{}^a$ through $22_{j+5}{}^a$ and $24_j{}^a$ through $24_{j+5}{}^a$, respectively. Charge packets corresponding to the bias potential $Y_0$ and a sum $Y_0+By$ are injected into the register $24^a$ in the sequence $Y_0$, $Y_0+By$, and propagate through the register $24^a$ as other charge packets are injected into the register $24^a$ in the same sequence, i.e., $Y_0$, $Y_0+By$. The variable B is an arbitrary constant of proportionality. The stages $24_j{}^a$ through $24_{j+5}{}^a$, for example, illustrate such a sequence where the subscripts (J) through (j+5) denote the same sequential position as described with reference to register $34^a$. The subscripts k+1, k, and k−1 of the signal y shown in the stages $24_{j+1}{}^a$, $24_{j+3}{}^a$, and $24_{j+5}{}^a$, respectively, denote the sequence of injection into the shift register $24^a$. For example, the charge packet $Y_0+By_{k-1}$ is injected before the charge packet $Y_0+By_k$.

Charge packets corresponding to the bias potential $Y_0$ and a difference $Y_0-\alpha y$ are injected into the register $22^a$ in the sequence $Y_0$, $Y_0-\alpha y$, and propagate through the shift register $22^a$ as other charge packets are injected into the register $22^a$ in the same sequence, i.e., $Y_0$, $Y_0-\alpha y$. The stages $(22_j{}^a)$ through $(22_{j+5}{}^a)$, for example, illustrate such a sequence of charge packets, where the subscripts (j) through (j+5) denote the same sequential position as described with reference to registers $24^a$ and $34^a$. The subscripts k+1, k, and k−1 of the function signal Y shown in the stages $22_{j+1}{}^a$, $22_{j+3}{}^a$, and $22_{j+5}{}^a$ denote the sequence of injection into the register 22. For example, the charge packet $Y_0-\alpha y_{k-1}$ is injected before the charge packet $Y_0\,\alpha y_k$. The variable $\alpha$ is an arbitrary constant of proportionality.

The charge packets $Y_0+By$ and $Y_0-\alpha y$ contained in alternate stages of the shift registers $22^a$ and $24^a$, respectively, are correlated against the corresponding charge packets $X_0+x$ contained in alternate stages of the register $34^a$ by the array of multipliers at $28^a$. For example, the packets corresponding to $Y_0+By_{(k+1)}$ and $Y_0-\alpha y_{(k+1)}$ are correlated against the packet corresponding to $X_0+x_{(k+1)}$ by a multiplier 200. In FIG. 17, the stages $22_{j+1}{}^a$ and $24_{j+1}{}^a$, and $34_{j+1}{}^a$, for example, are coupled to inputs 200c, 200d, and 200e, respectively, of the multiplier 200. The output terminals 200a and 200b of the multiplier 200 are coupled to the summing lines 21$^a$ and 23$^a$.

Figure 18:
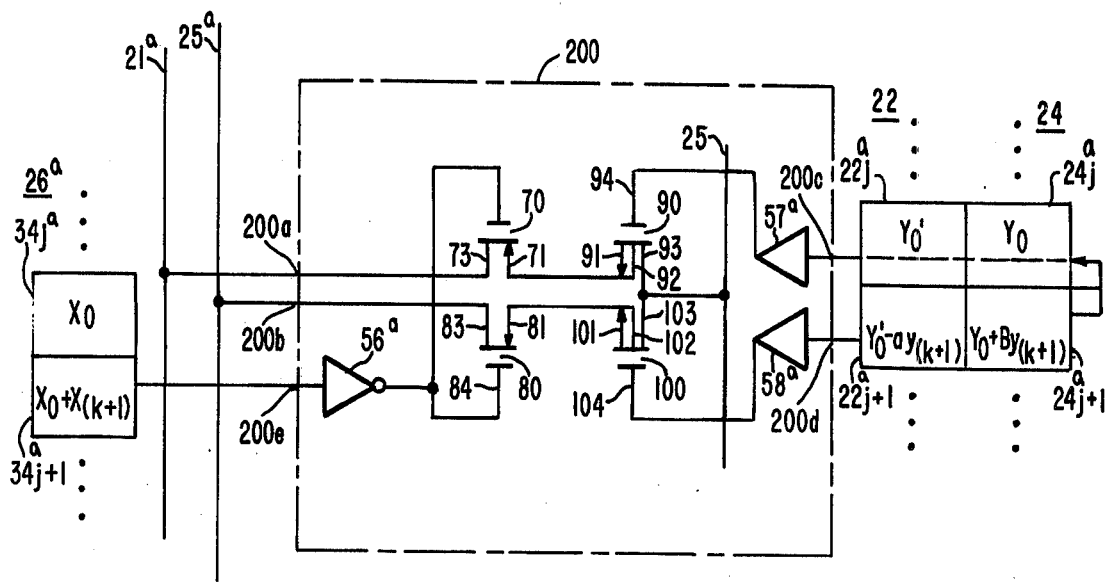
FIG. 18 shows a multiplier suitable for use with the correlator of FIG. 16.

FIG. 18 shows a detailed view of the multiplier 200 of FIG. 17, for example, suitable for use in a correlator such as that described above and shown in FIG. 17. Also shown are the stages 22$_j{}^a$, 22$_{j+1}{}^a$, 24$_j{}^a$, 24$_{j+1}{}^a$, 34$_j{}^a$, and 34$_{j+1}{}^a$ shown in FIG. 17. The buffers 56$^a$, 57$^a$, and 58$^a$ are effective to isolate the gates of P-channel metal-oxide-semiconductor (PMOS) transistors 70$^a$ and 80$^a$ and N-channel MOS (NMOS) transistors 90$^a$ and 100$^a$ from the stages 22$_{j+1}{}^a$, 24$_{j+1}{}^a$ and 34$_{j+1}{}^a$ of FIG. 17 in order to eliminate interaction between the two independent data sets of delay means 20$^a$ and 26$^a$ and also to provide the two independent AC function signals x$_k$ and y$_k$ with adequate DC offset or bias separation to allow for the sum of the two threshold voltages plus the residual PMOST body effect and to allow for maximum signal excursion at outputs 200a and 200b. A common positive supply line 25$^a$ provides drain biasing for the transistors 90 and 100. Typically, the voltage applied to the supply line 25$^a$ is of similar magnitude to the substrate voltage of the P-channel pentodes 70 and 80 which is typically the most positive voltage in the circuit. The multiplier 200 utilizes the square-law characteristic of an MOS transistor operating in the current saturation or pentode region, which region is shown by a curve portion 19c–19b in FIG. 19. The drain current, I$_D$, for a MOS transistor operating in the pentode region is given as:

$$I_D = K (V_{GS} - V_T)^2$$

where:
K = ½α
V$_{GS}$ = gate-to-source voltage
V$_T$ = threshold voltage

For complementary MOSFET pentode pairs connected in series such as transistor pair NMOS transistor 100 and PMOS transistor 80, and transistor pair NMOS transistors 90 and PMOS transistor 70, the current at the drains 103 and 83, for example, is proportional to the square of the sum of the voltages at the gates 104 and 84, provided that the two transistors 100 and 80 are in current saturation. In order to perform the squaring operation efficiently the bodies of the MOSFET pentodes 70, 90, 100 and 80 must be lightly doped. In conventional CMOS, however, the doping of PMOST bodies such as transistors 80 and 70 is about 1×10$^{15}$ while the doping of NMOST bodies such as transistors 100 and 90 is near 4×10$^{16}$. Such heavy doping of the transistors 100 and 90 would completely destroy the desired squaring action. The effect of heavy doping of the transistors 100 and 90 is reduced by coupling the source 91 and the body 92 of the transistor 90 and coupling the source 101 and the body 102 of the transistor 100.

The series connected CMOS pentode pair 80 and 100 and the series connected CMOS pentode pair 70 and 90 are connected in a balanced or push-pull configuration with respect to the signals received from the analog delay means 20 and 26. Both of the transistor pairs, 80 and 100, and 70 and 90, receive a signal corresponding to the combination X$_0$+X$_{k+1}$ as a common input voltage at the input 200 via the buffer 56$^a$. However, the two other input signals are balanced, i.e., of equal magnitude but opposite sign or phase (180 degrees out of phase). One signal is a voltage corresponding to a bias potential plus a signal, for example, stage 24$_{j+1}{}^a$ and the content thereof is coupled to the gate of transistor 90 via the buffer 57$^a$, and the other signal is a voltage corresponding to a bias potential minus a signal, for example, the stage 22$_{j+1}{}^a$ and the content thereof is coupled to the gate 104 of the transistor 100 via the buffer 58$^a$. This balanced configuration is effective to cancel a larger portion of the bias due to threshold non-uniformities than would be possible with a single series connected CMOS pair of transistors, thereby reducing the level of cancellation needed at subsequent steps of the correlation process.

Figure 20:
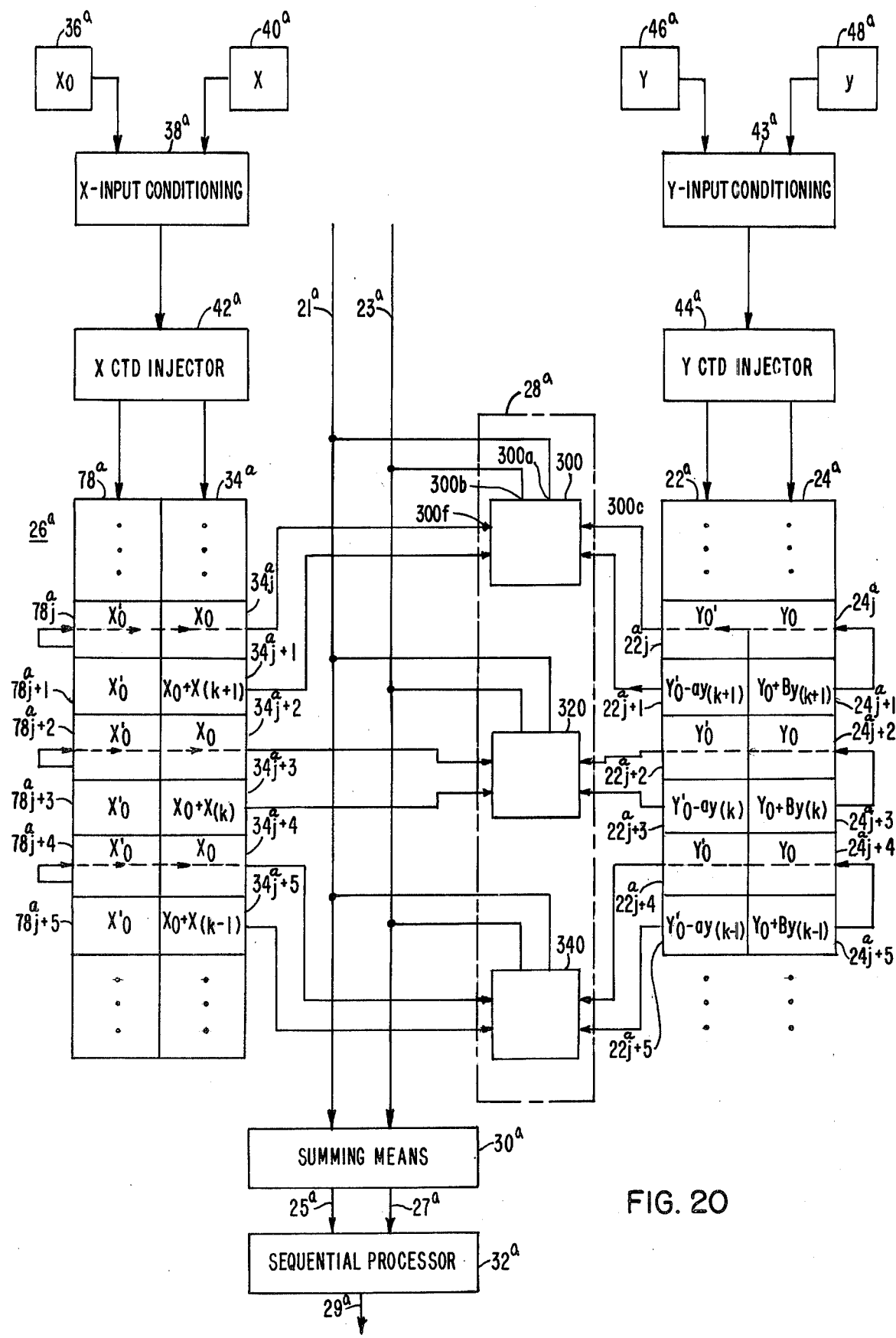
FIG. 20 shows the correlator of FIG. 16 including an additional shift register and it shows a particular sequence of charge packets in the shift registers thereof.

Another embodiment of the present invention is illustrated in FIG. 20 wherein the analog delay means 26$^a$ includes, in addition to the shift register 34$^a$ illustrated in FIG. 18, a shift register 78 having, for example, stages 78$_j{}^a$ through 78$_{j+5}{}^a$. In operation of the embodiment of the present invention shown in FIG. 20, the sequence of the signals injected into the shift register 34$^a$ is identical to that described in reference to the operation of the shift register 34$^a$ in the embodiment shown in FIG. 17, i.e., X$_0$, X$_0$+x. Charge packets corresponding to the bias potential X$_0$ are injected by the injector 42$^a$ into the cells of the shift register 78$^a$ along with each injection of a charge packet into the shift register 34, i.e., in the sequence X$_0$, X$_0$, X$_0$ . . . . The stages 78$_j{}^a$ through 78$_{j+5}{}^a$, for example, illustrate such a sequence, where the subscripts j through j+5 denote the same sequential position as similar subscripts of the resisters 22$^a$, 24$^a$, and 34$^a$. The operation of the shift registers 22$^a$ and 24$^a$ of the analog delay means 20$^a$ is also identical to that described in reference to the embodiment shown in FIG. 18. The charge packets Y$_0$+By and Y$_0$−αy contained in alternate cells of the shift registers 22$^a$ and 24$^a$, respectively, are correlated against the corresponding charge packets X$_0$+x contain in alternate stages of the register 34$^a$ and charge packets X$_0$ contained in alternate stages of the register 78$^a$, by multipliers at 28$^a$. For example, the packets corresponding to Y$_0$+By$_{(k+1)}$ and Y$_0$−αy$_{(k+1)}$ and in the cells 24$_{j+1}{}^a$ and 22$_{j+1}{}^a$, respectively, are correlated against the packets corresponding to X$_0$+x$_{(k+1)}$ and X$_0$ in the stages 34$_{j+1}{}^a$ and 78$_j{}^a$, respectively. This result is achieved, for example, by coupling the stages 22$_{j+1}$ and 24$_{j+1}$, 34$_{j+1}$, and 78$_j{}^a$ to inputs 300d, 300c, 300f, and 300e, respectively, of a multiplier 300. The output terminals 300a and 300b of the multiplier 300 are coupled to the summing lines 21$^a$ and 23$^a$, respectively.

Figure 21:
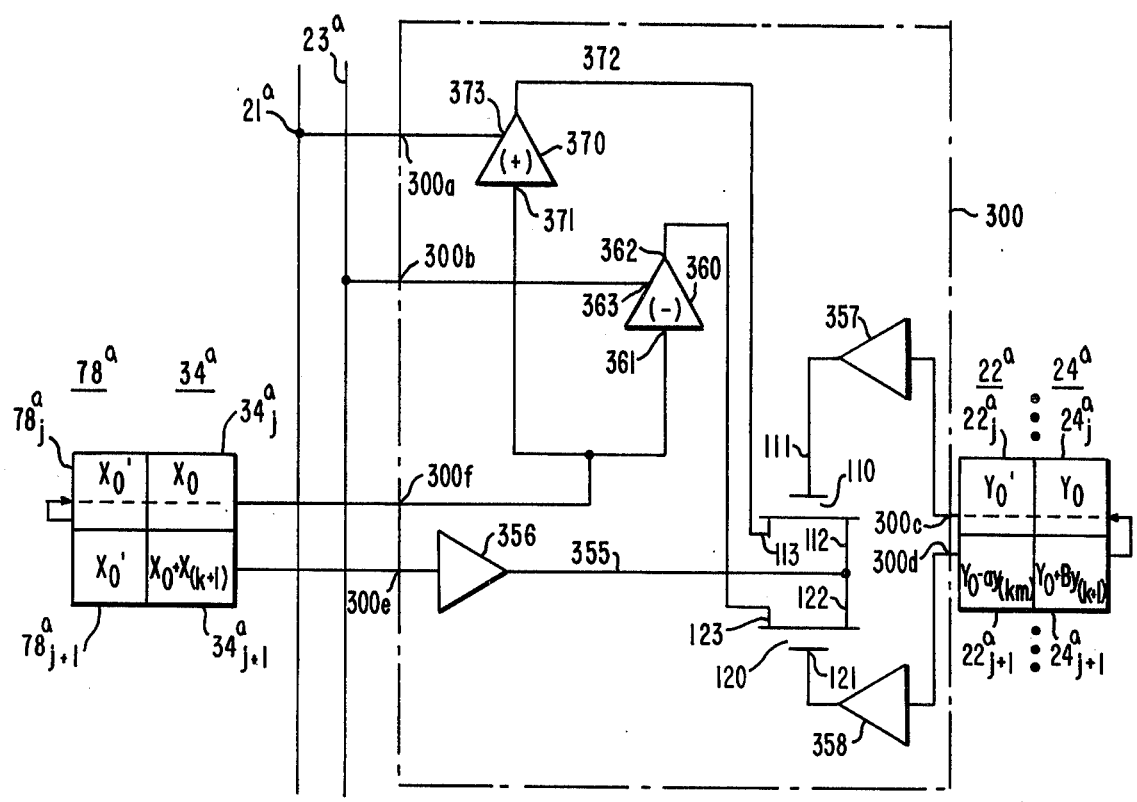
FIG. 21 shows a multiplier suitable for use with the correlator of FIG. 20.

FIG. 21 shows an embodiment of the multiplier 300, for example, suitable for use in conjunction with the embodiment of the present invention shown in FIG. 20. MOS matched transistors 110 and 120 operate push-pull in the triode region as shown by a curve portion 19b–19a in FIG. 19. Buffers 357 and 358 perform only a driving function and principally are required to isolate the gates 111 and 121 from the drains 112 and 122, respectively.

Buffers 356, 360, and 370 have more stringent requirements, however. The buffer 356, in addition to providing isolation between the signals at the gates 111 and 121 and the signals at the buffer output 355, must be able to supply the differential or unbalanced current between triodes 110 and 120, i.e., since signals of equal magnitude but opposite sign are applied to gates 111 and 121 from the stages 22$_{j+1}{}^a$ and 24$_{j+1}{}^a$, the triode pair 110 and 120 is effectively operating push-pull very little current need be supplied by the buffer 356. A much smaller device is required to implement the buffer 356, as a result of the balanced circuit of FIG. 21, than if the buffer 356 is required to supply current to an unbalanced circuit, i.e., where other than equal but opposite signals are applied to the gate 111 and 121. The embodiment of FIG. 21 shows an analog delay means $20^a$ having two shift register devices $22^a$ and $24^a$, selected sequentially corresponding cells of which, contain equal but opposite signals in order to achieve the aforementioned balancing effect. Such an effect is difficult to achieve using only an analog delay means having only one such shift register device.

Figure 22A:
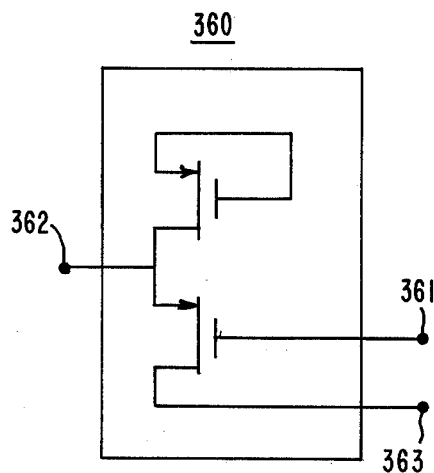
FIGS. 22a and 22b shows a more detailed view of a circuit that can be used as a particular pair of buffers in the multiplier of FIG. 21.
Figure 22B:
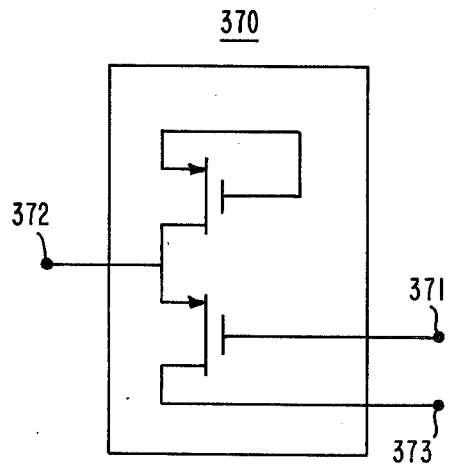

The buffers 360 and 370 must also supply current flowing in the triodes 110 and 120 and must allow the measurement of the signal current. In addition, the buffers 360 and 370 must provide source nodes for the triodes 110 and 120 such as nodes 362 and 372, the potential of which approaches an AC virtual ground, i.e., nodes which have a low AC impedance, the voltage fluctuations at which node are very small and independent of the current at the node. FIGS. 22A and 22B show, for example, an embodiment suitable for use as the buffers 360 and 370.

Figure 23:
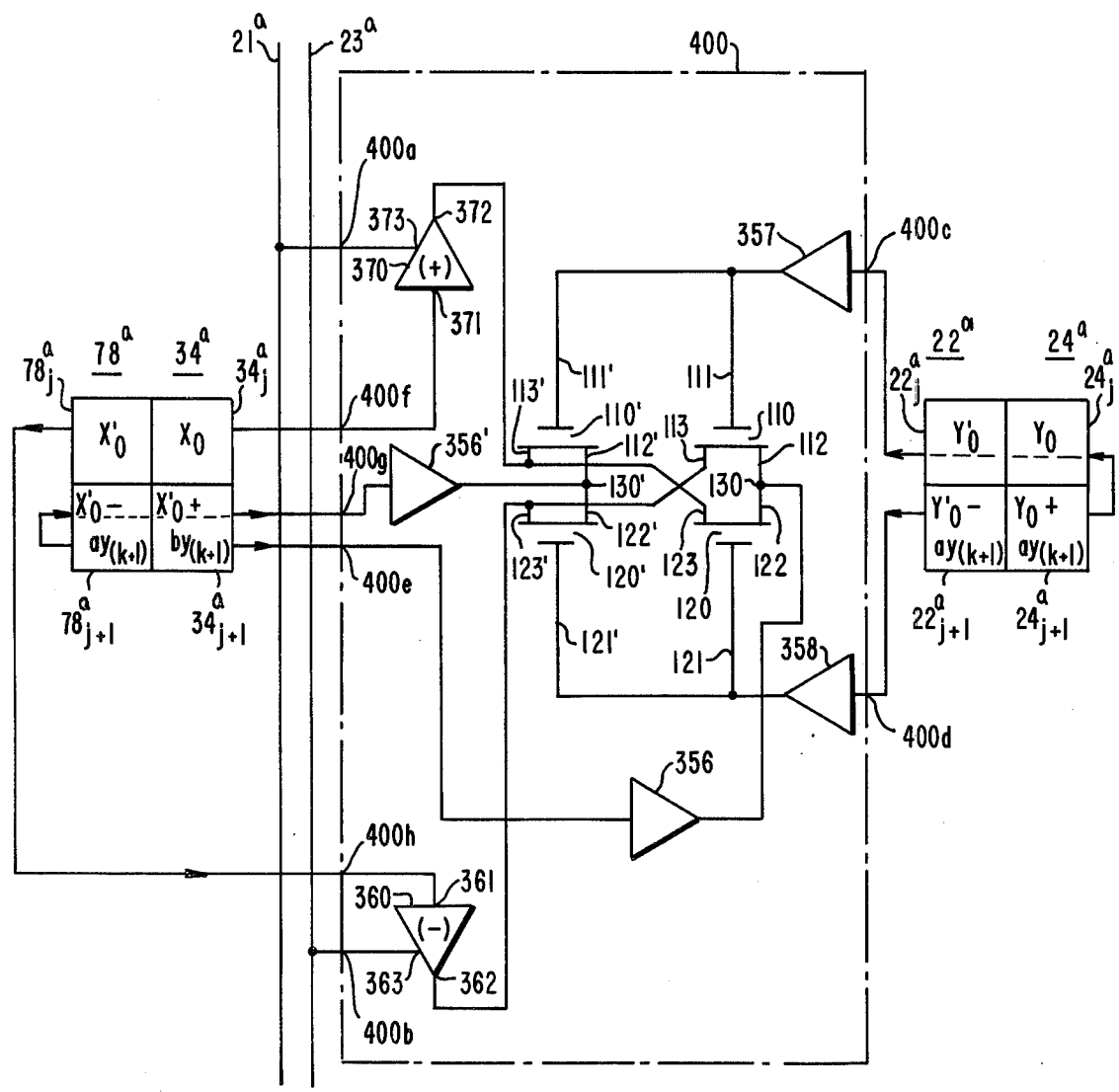
FIG. 23 shows another multiplier suitable for use with the correlator of FIG. 20.
Figure 24:
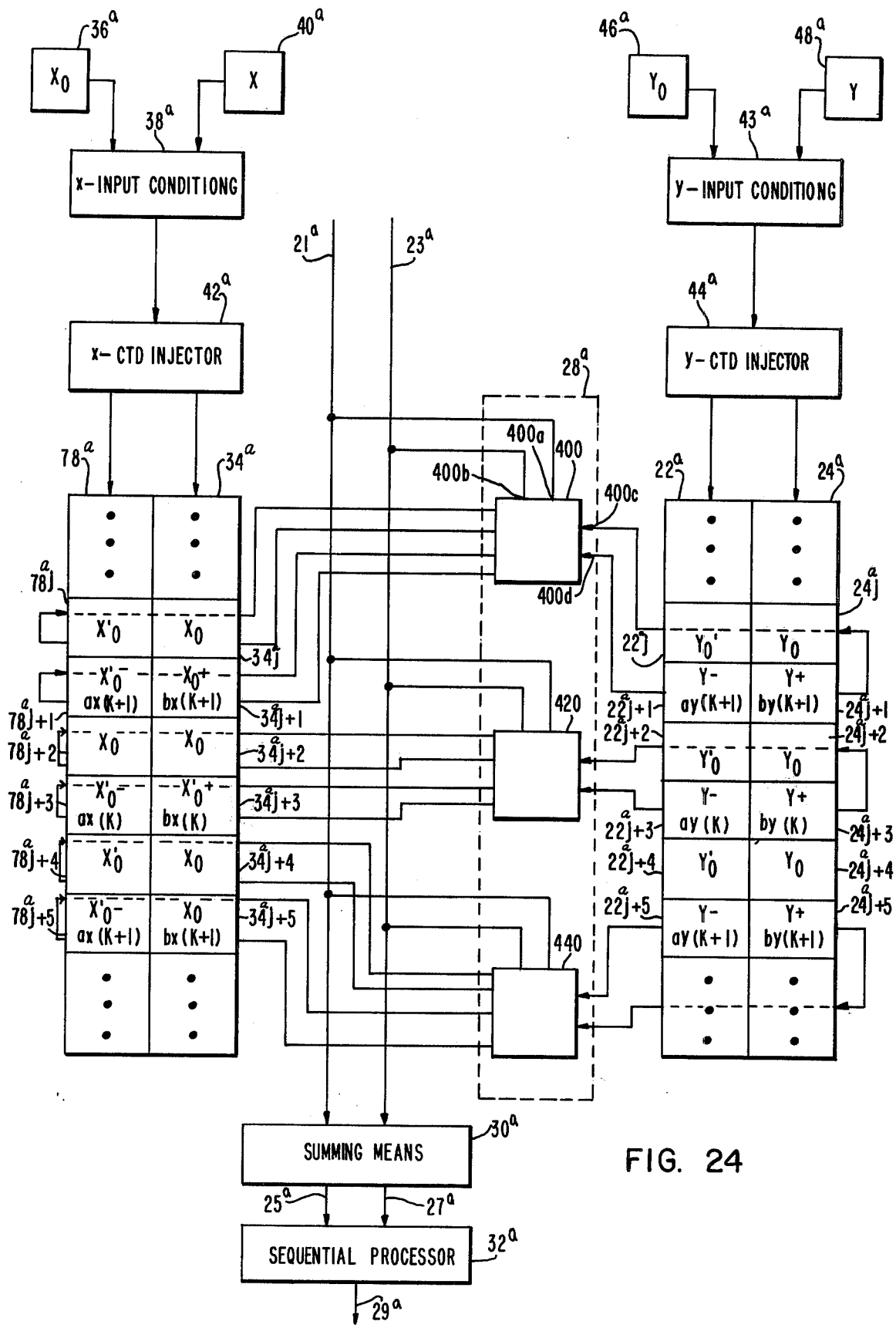
FIG. 24 shows a particular sequence of charge packets in the shift registers of the correlator of FIG. 20 when used in conjunction with the multiplier of FIG. 23.

FIG. 23 shows a second multiplier 400, for example, suitable for operation in conjunction with the embodiment of the present invention shown in FIG. 24. A second set of matched MOS transistors 110' and 120' add a second level of balancing. The sources 113' and 123' of the matched MOS transistors 110' and 120', respectively, are cross-coupled to the sources 123 and 113 of the matched MOS transistors 120 and 110, respectively. The set of transistors 110' and 120' is operated push-pull by coupling their drains at 130' and driving the drains in common with a buffer 356'. Similarly, the set of transistors 110 and 120 is operated push-pull by coupling their drains at 130 and driving them in common with the buffer-driver 356. The gates 111 and 111' of the transistors 110 and 110', respectively, are driven in parallel by the buffer 357, which buffer 357 is coupled to the cell $24_{j+1}{}^a$. The gates 121 and 121' of the transistors 120 and 120', respectively, are driven in parallel by the buffer 358, which buffer 358 is coupled to the cell $22_{j+1}{}^a$.

What is claimed is:

1. A method of providing a signal indicative of the sum of the products of samples of first and second analog signals comprising the steps of:
  a. forming charge packets including the steps of:
    1. forming a predetermined number of first charge packets indicative of a first bias potential;
    2. forming said predetermined number of second charge packets indicative of samples of said first analog signal offset by said first bias potential;
    3. forming said predetermined number of third charge packets indicative of a second bias potential; and
    4. forming said predetermined number of fourth charge packets indicative of samples of said second analog signal offset by said second bias potential; and
  b. sequentially multiplying said charge packets including the steps of:
    1. multiplying at least one of said second charge packets by at least one of said third charge packets to provide a first sum-of-products signal;
    2. multiplying said second charge packets by at least one of said fourth charge packets and summing the products thereobtained to provide a second sum-of-products signal;
    3. multiplying at least one of said first charge packets by at least one of said fourth charge packets and summing the products thereobtained to provide a third sum-of-products signal;
    4. multiplyinng at least one of said first charge packets by at least one of said third charge packets and summing the products thereobtained to provide a fourth sum-of-products signal; and
    5. forming an algebraic combination of signals including additive and subtractive contributions, said additive contributions including said second sum-of-products signal and said fourth sum-of-products signal, said subtractive contributions including said first sum-of-products signal and said third sum-of-products signal, said algebraic combination indicative of the sum of the products of the samples of said first and second analog signals without erroneous contributions due to multiple threshold non-uniformities.

2. The method of claim 1 wherein the step of forming said charge packets includes injecting said charge packets in stages of at least one charge transfer device (CTD).

3. The method of claim 2 wherein the step of injecting said charge packets includes the steps of:
  injecting one of said first charge packets and then one of said second charge packets in stages of a first CTD, and repeating the sequence of injection; and
  injecting one of said third charge packets and then one of said fourth charge packets in stages of a second CTD, and repeating the sequence of injection.

4. The method of claim 1 wherein the step of forming said algebraic combination of signals includes the steps of:
  a. grounding a first capacitor, applying said first sum-of-products signal to said first capacitor, and disconnecting said first capacitor from ground;
  b. grounding a second capacitor, coupling said first and second capacitors, applying said second sum-of-products signal to said first capacitor, uncoupling said first and second capacitor, and disconnecting said second capacitor from ground;
  c. grounding said first capacitor, applying said third sum-of-products signal to said first capacitor, and disconnecting said first capacitor from ground;
  d. grounding a third capacitor, coupling said first and second capacitors, coupling said second and third capacitors, applying said fourth sum-of-products signal to said first capacitor, and disconnecting said first and second capacitors from said third capacitor.

5. An analog-analog signal processing device for providing a signal indicative of the sum of the products of samples of first and second analog signals comprising:
  a. first input means for providing a first signal indicative of a first bias potential and a second signal indicative of samples of said first analog signal offset by said first bias potential,
  first injector means coupled to said first input means for providing charge packets indicative of said first and second signals,
  first charge transfer analog delay means coupled to said first injector means having a first charge transfer shift register device, said shift register device including a predetermined number of stages for holding and propagating charge packets;

b. second input means for providing a third signal indicative of a second bias potential and a fourth signal indicative of samples of said second analog signal offset by said second bias potential, second injector means coupled to said second input means for providing charge packets indicative of said third and fourth signals, second charge transfer analog delay means coupled to said second injector means having second and third charge transfer shift register devices, said second and third shift register devices each including said predetermined number of stages for holding and propagating charge packets, sequentially corresponding stages of said first and second analog delay means comprising a set of stages;

c. each of said sets of stages having inputs of a multiplying means coupled thereto for providing product signals indicative of the products of charge packets in each of said sets of stages of said first and second analog delay means;

d. summing means for summing said product signals to provide a sum-of-products signal; and e. charge storage circuitry for storing said voltage sum-of-products signal.

6. An analog-analog signal processing device according to claim 5 wherein said first analog delay means further includes a fourth shift register device.

7. An analog-analog signal processing device according to claim 5 wherein said multiplier means includes:
a first pair of buffered MOS transistors operated push-pull by said second shift register device and said third shift register device,
a second pair of buffered MOS transistors having input signals applied thereto from said first pair of transistors and said first shift register device and output terminals coupled to said summing means.

8. An analog-analog signal processing device according to claim 6 wherein said multiplier means includes a pair of MOS transistors operated push-pull via a first pair of buffers by said third shift register and said fourth shift register, an input of said pair of transistors being coupled to said first shift register by a first buffer and outputs thereof being coupled to a second pair of buffers, said second pair of buffers coupled to said summing means.

9. An analog-analog signal processing device according to claim 6 wherein said multiplier means includes:

a. a first pair of transistors including first and second MOS transistors, a second pair of transistors including third and fourth MOS transistors, each of the transistors of said first and second pairs of transistors having a source, a gate, and a drain, the sources of said first and second transistors coupled together, the drains of said third and fourth transistors coupled together;

b. means coupled to said first and second shift registers for driving the drains of said first and second pairs of transistors, respectively;

c. means coupled to said third and fourth shift registers, and to the gates of said first and second pairs of transistors, responsive to signals in said third and fourth shift registers for operating said first and second pairs of transistors push-pull;

d. means coupled to said first and second shift registers and to the sources of said first and second pairs of transistors for coupling an output signal to said summing means.

* * * * *